(12) United States Patent
Huang et al.

(10) Patent No.: US 11,789,045 B2
(45) Date of Patent: Oct. 17, 2023

(54) CURRENT SENSING CIRCUIT

(71) Applicant: uPI semiconductor corp., Zhubei (TW)

(72) Inventors: Chao-Chung Huang, Zhubei (TW);
Kuo-Jen Kuo, Zhubei (TW); Yi-Xian Jan, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/830,487

(22) Filed: Jun. 2, 2022

(65) Prior Publication Data

US 2023/0003771 A1 Jan. 5, 2023

(30) Foreign Application Priority Data

Jul. 5, 2021 (CN) .......................... 202110755736.X

(51) Int. Cl.
*G01R 19/00* (2006.01)
*G01R 1/20* (2006.01)
*H03F 3/343* (2006.01)
*G01R 19/10* (2006.01)

(52) U.S. Cl.
CPC ......... *G01R 19/0092* (2013.01); *G01R 1/203* (2013.01); *G01R 19/10* (2013.01); *H03F 3/343* (2013.01)

(58) Field of Classification Search
CPC ................ G01R 19/0092; G01R 19/00; H03F 2200/261; H03F 2200/462; H03F 3/45475
See application file for complete search history.

(56) References Cited

U.S. PATENT DOCUMENTS

| 5,862,301 | A | * | 1/1999 | Gontowski, Jr. ......... H02P 1/26 |
| | | | | 318/632 |
| 6,621,259 | B2 | | 9/2003 | Jones et al. |
| 7,196,581 | B2 | | 3/2007 | Gammie et al. |
| 9,882,482 | B1 | * | 1/2018 | Hendry ................. H02M 3/158 |
| 2013/0271216 | A1 | * | 10/2013 | Liu ..................... H03F 3/45179 |
| | | | | 330/254 |
| 2016/0341772 | A1 | * | 11/2016 | Roberts ................ G01R 35/005 |
| 2021/0288635 | A1 | * | 9/2021 | Wu ..................... H03K 17/0822 |
| 2022/0399859 | A1 | * | 12/2022 | Cooney ................. H03M 1/462 |

* cited by examiner

*Primary Examiner* — Dominic E Hawkins
(74) *Attorney, Agent, or Firm* — McClure, Qualey & Rodack, LLP

(57) ABSTRACT

A current sensing circuit includes a filtering circuit, an amplifier, a first resistor, a first transistor and a second transistor. The filtering circuit is coupled to two terminals of a sensing resistor. The amplifier has a first input terminal, a second input terminal and an output terminal. The second input terminal is coupled to the filtering circuit. The first resistor is coupled between the filtering circuit and the first input terminal of amplifier. A control terminal of the first transistor is coupled to the output terminal of amplifier, and its first terminal is coupled to the first input terminal of amplifier and its second terminal is grounded through a second resistor. A control terminal of the second transistor is coupled to the output terminal of amplifier, and its first terminal is coupled to the second input terminal of amplifier and its second terminal is grounded through a third resistor.

6 Claims, 2 Drawing Sheets

CURRENT SENSING CIRCUIT

BACKGROUND OF THE INVENTION

1. Field of the Invention

The invention relates to current sensing; in particular, to a current sensing circuit having good sensing accuracy.

2. Description of the Prior Art

As shown in FIG. 1, a conventional current sensing circuit 1 obtains an output voltage VO by measuring a difference between voltages V1 and V2 across a sensing resistor RSEN (i.e., an input voltage difference ΔV) and amplifying the voltage difference and its magnification ratio (i.e., a gain) is a ratio of resistances of a second resistor R2 and a first resistor R1. After calculation, a value of a current flowing through the sensing resistor RSEN can be obtained.

However, when a filter circuit including a filter capacitor CF and a filter resistor RF is disposed on a sensing path, the magnification ratio (i.e., the gain) will change, which is deduced as follows:

the first current $$I1 = \frac{V1 - V3}{RF + R1} \quad (1)$$

the input voltage difference ΔV=V1−V2  (2)

(RF+R1)*I1=V1−V3  (3)

assuming I2=0, then V3=V4=V2 the input voltage difference ΔV=(RF+R1)*I1  (4)

the output voltage $$VO = \frac{\Delta V}{(RF + R1)} * R2 \quad (5)$$

the magnification ratio $$\text{Gain} = \frac{VO}{\Delta V} = \frac{R2}{(RF + R1)} \quad (6)$$

According to the formula (6), it can be known that since the magnification ratio (i.e., the gain) Gain is affected by the resistance of the filter resistor RF, the sensing accuracy of the conventional current sensing circuit 1 will become poor. This problem still needs to be solved.

SUMMARY OF THE INVENTION

Therefore, the invention provides a current sensing circuit to solve the above-mentioned problems of the prior arts.

An embodiment of the invention is a current sensing circuit. In this embodiment, the current sensing circuit is coupled to a sensing resistor. The current sensing circuit includes a filtering circuit, an amplifier, a first resistor, a second resistor, a third resistor, a first transistor and a second transistor. The filtering circuit is coupled to two terminals of the sensing resistor. The amplifier has a first input terminal, a second input terminal and an output terminal. The second input terminal is coupled to the filtering circuit. The first resistor is coupled between the filtering circuit and the first input terminal of the amplifier. A control terminal of the first transistor is coupled to the output terminal of the amplifier, and a first terminal of the first transistor is coupled to the first input terminal of the amplifier and a second terminal of the first transistor is grounded through the second resistor. A control terminal of the second transistor is coupled to the output terminal of the amplifier, and a first terminal of the second transistor is coupled to the second input terminal of the amplifier and a second terminal of the second transistor is grounded through the third resistor.

In an embodiment, the first transistor and the second transistor are matched to each other.

In an embodiment, there is an input voltage difference between the two terminals of the sensing resistor and the second terminal of the first transistor has an output voltage, wherein a ratio of a first current flowing through the first transistor to a second current flowing through the second transistor is equal to a ratio of a resistance of the third resistor to a resistance of the second resistor.

In an embodiment, the filter circuit includes a first filter resistor, a second filter resistor and a filter capacitor. The first filter resistor is coupled between the first terminal of the sensing resistor and the first resistor, and the second filter resistor is coupled between the second terminal of the sensing resistor and the second input terminal of the amplifier, a first terminal of the filter capacitor is coupled between the first resistor and the first filter resistor and a second terminal of the filter capacitor is coupled between the second filter resistor and the second input terminal of the amplifier. The first current and the second current flow through the first filter resistor and the second filter resistor respectively.

In an embodiment, when the first current is equal to the second current and the resistance of the second resistor and the resistance of the third resistor are equal, a ratio of the output voltage to the input voltage difference is equal to a ratio of the resistance of the second resistor to a resistance of the first resistor.

In an embodiment, if the resistance of the first resistor is greater than ten times greater than the resistances of the first filter resistor and the second filter resistor, the ratio of the output voltage to the input voltage difference is equal to the ratio of the resistances of the second resistor to the first resistor.

Compared with the prior art, the current sensing circuit of the invention adds a compensation path and controls a ratio of currents flowing through the transistors of the sensing path and the compensation path by selecting a ratio of resistances of the sensing path and the compensation path, thereby compensating the error on the sensing path to reduce the influence caused by the resistance on the sensing path, so that the magnification ratio (i.e., the gain) is no longer related to the resistance of the filter resistors, so the good sensing accuracy of the current sensing circuit can be effectively maintained.

The advantage and spirit of the invention may be understood by the following detailed descriptions together with the appended drawings.

BRIEF DESCRIPTION OF THE APPTERMINALED DRAWINGS

DETAILED DESCRIPTION OF THE INVENTION

Figure 1:
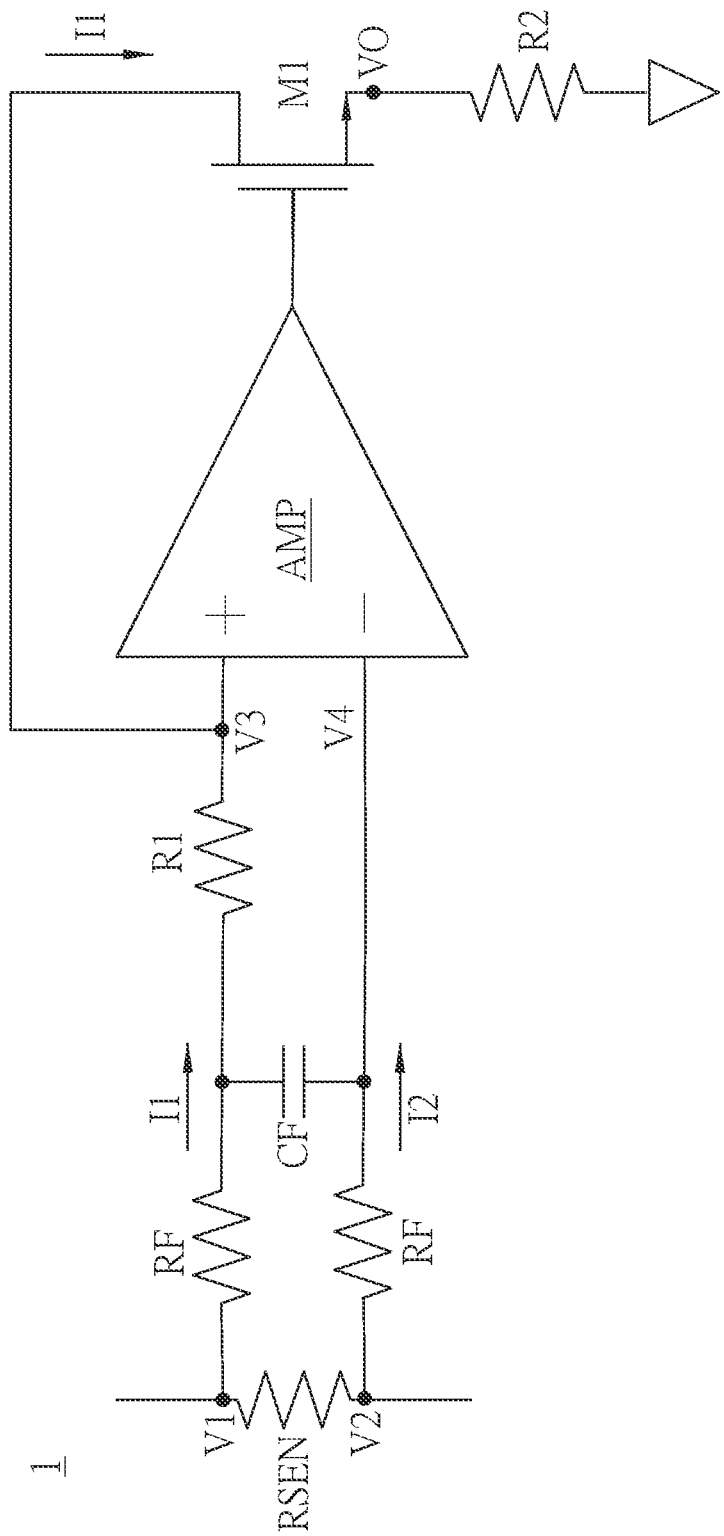
FIG. 1 illustrates a schematic diagram of the conventional current sensing circuit.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment of the invention is a current sensing circuit. In this embodiment, the current sensing circuit is coupled to both terminals of a sensing resistor and the current sensing circuit is used for sensing a value of a current flowing through the sensing resistor.

Figure 2:
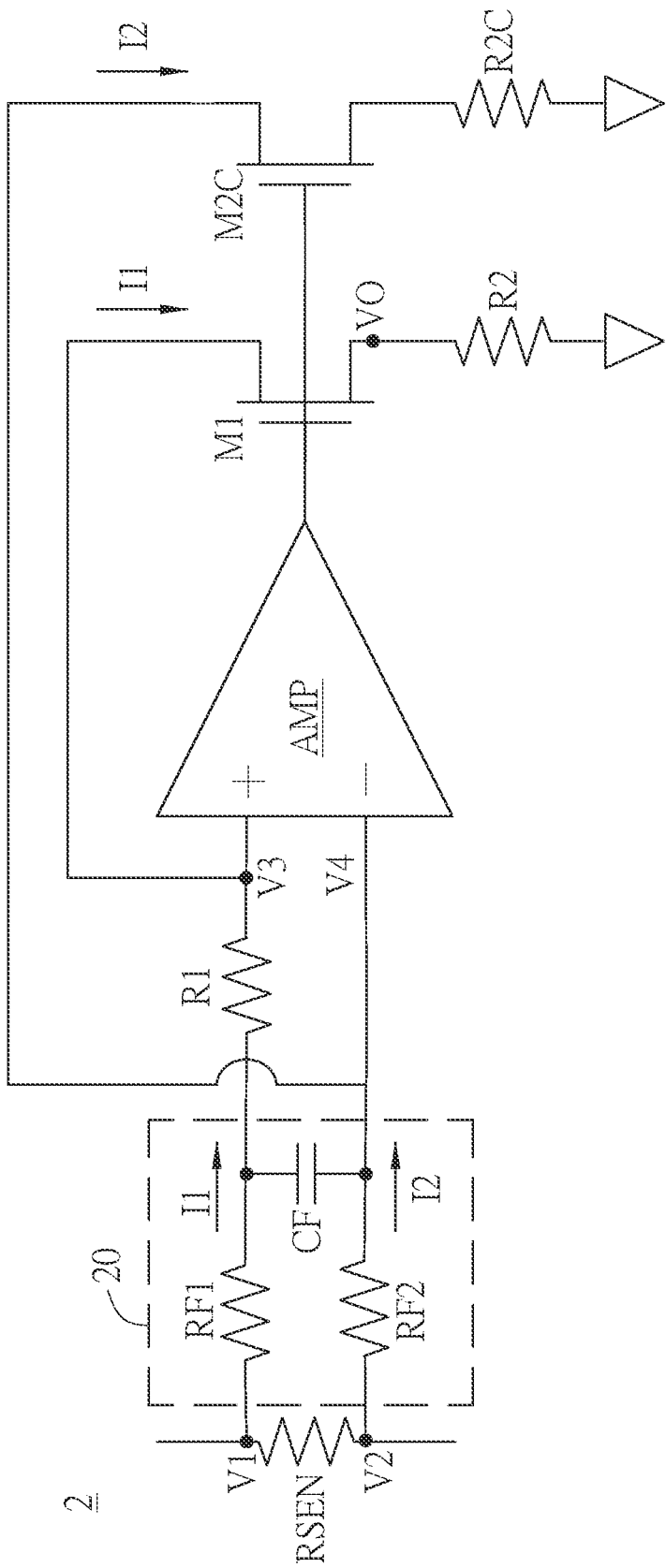
FIG. 2 illustrates a schematic diagram of the current sensing circuit in an embodiment of the invention.

Please refer to FIG. 2. FIG. 2 illustrates a schematic diagram of the current sensing circuit in this embodiment. As shown in FIG. 2, the current sensing circuit 2 is coupled to both terminals of the sensing resistor RSEN. The current sensing circuit 2 includes a filter circuit 20, an amplifier AMP, a first resistor R1, a second resistor R2, a third resistor R3, a first transistor M1 and a second transistor M2C. The first transistor M1 and the second transistor M2C are matched with each other.

The filter circuit 20 is coupled to the both terminals of the sensing resistor RSEN respectively. The filter circuit 20 is coupled to a first input terminal + of the amplifier AMP through the first resistor R1. The filter circuit 20 is coupled to a second input terminal − of the amplifier AMP.

In detail, the filter circuit 20 includes filter resistors RF1~RF2 and a filter capacitor CF. One terminal of the filter resistor RF1 is coupled to a first terminal of the sensing resistor RSEN (having a voltage V1) and the other terminal of the filter resistor RF1 is coupled to the first resistor R1. The first resistor R1 is coupled to the first input terminal + (having a voltage V3) of the amplifier AMP. One terminal of the filter resistor RF2 is coupled to the second terminal of the sensing resistor RSEN (having a voltage V2) and the other terminal of the filter resistor RF2 is coupled to the second input terminal − (having a voltage V4) of the amplifier AMP. One terminal of the filter capacitor CF is coupled between the filter resistor RF1 and the first resistor R1 and the other terminal of the filter capacitor CF is coupled between the filter resistor RF2 and the second input terminal − of the amplifier AMP. A first current I1 flows through the filter resistor RF1 and a second current I2 flows through the filter resistor RF2.

The first input terminal + of the amplifier AMP is coupled to the first resistor R1 and the second input terminal − is coupled to the filter circuit 20. The output terminal of the amplifier AMP is coupled to a control terminal of the first transistor M1 and a control terminal of the second transistor M2C. A first terminal of the first transistor M1 is coupled to the first input terminal + of the amplifier AMP and a second terminal of the first transistor M1 is grounded through the second resistor R2. A first terminal of the second transistor M2C is coupled to the second input terminal − of the amplifier AMP and a second terminal of the second transistor M2C is grounded through the third resistor R2C.

It should be noted that a ratio of the first current I1 flowing through the first transistor M1 to the second current I2 flowing through the second transistor M2C is equal to a ratio of a resistance of the third resistor R2C to a resistance of the second resistor R2. The two terminals of the sensing resistor RSEN have an input voltage difference ΔV (that is to say, the difference between the voltage V1 of the first terminal and the voltage V2 of the second terminal), and the second terminal of the first transistor M1 has an output voltage VO, and a ratio of the output voltage VO to the input voltage difference ΔV is called a magnification ratio (i.e., a gain) Gain.

Assuming that the resistances of the filter resistors RF1 and RF2 are equal and both are represented by RF, the derivation is as follows:

the first current $$I1 = \frac{V1 - V3}{RF + R1} \quad (7)$$

the second current $$I2 = \frac{V2 - V4}{RF} \quad (8)$$

the output voltage difference $\Delta V = V1 - V2$     (9)

$(RF+R1)*I1 = V1-V3$     (10)

$RF*I2 = V2-V4$

When the voltages of the first input terminal + and the second input terminal − of the amplifier AMP are equal, that is to say, V3=V4, the input voltage difference $\Delta V = (RF+R1)*I1 - RF*I2$     (12)

Assuming that the first current I1 and the second current I2 are equal, the first transistor M1 and the second transistor M2C are the same, and the second resistor R2 and the third resistor R2C are the same, then it can be obtained:

the input voltage difference $\Delta V = R1*I1$     (13)

the output voltage $$VO = \frac{\Delta V}{R1} * R2 \quad (14)$$

the magnification ratio (the gain)

$$\text{Gain} = \frac{VO}{\Delta V} = \frac{R2}{R1} \quad (15)$$

According to the formula (15), it can be clearly known that the magnification ratio (i.e., the gain) Gain of the current sensing circuit 1 of the invention is only related to the ratio of the resistances of the second resistor R2 and the first resistor R1, and it is not related to the resistance on the sensing path, so that the magnification ratio (i.e., the gain) of the current sensing circuit 1 is not affected by the resistances of the filter resistors RF1~RF2, and the good sensing accuracy of the current sensing circuit 1 can be effectively maintained.

Continuing from the above, in order to reduce the second current I2, it is assumed that the first current I1 is n times the second current I2, that is to say, I1=n*I2 and R2=(1/n)*R2C, then it can be obtained from the formula (12):

the input voltage difference $$\Delta V = (RF+R1)*I1 - RF*\frac{1}{n}*I1 = \left(\left(1-\frac{1}{n}\right)*RF+R1\right)*I1 \quad (16)$$

If the resistance of the first resistor R1 is greater than ten times greater than the resistance of the filter resistor RF, the formula (16) can be simplified as:

the input voltage difference $\Delta V=R1*I1$ (17)

Since the formula (17) is the same as the formula (13), the magnification ratio (i.e., the gain) Gain representing the current sensing circuit 1 is only related to the ratio of the resistances of the second resistor R2 and the first resistor R1, so that the magnification ratio (i.e., the gain) Gain of the current sensing circuit 1 is not affected by the resistance of the filter resistor, so the good sensing accuracy of the current sensing circuit 1 can be effectively maintained.

Compared with the prior art, the current sensing circuit of the invention adds a compensation path and controls a ratio of currents flowing through the transistors of the sensing path and the compensation path by selecting a ratio of resistances of the sensing path and the compensation path, thereby compensating the error on the sensing path to reduce the influence caused by the resistance on the sensing path, so that the magnification ratio (i.e., the gain) is no longer related to the resistance of the filter resistors, so the good sensing accuracy of the current sensing circuit can be effectively maintained.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A current sensing circuit, coupled to a sensing resistor, the current sensing circuit comprising:
    a filtering circuit, coupled to two terminals of the sensing resistor respectively;
    an amplifier having a first input terminal, a second input terminal and an output terminal, the second input terminal being coupled to the filtering circuit;
    a first resistor, coupled between the filtering circuit and the first input terminal of the amplifier;
    a first transistor, a control terminal of the first transistor being coupled to the output terminal of the amplifier, a first terminal of the first transistor being coupled to the first input terminal of the amplifier and a second terminal of the first transistor being grounded through a second resistor; and
    a second transistor, a control terminal of the second transistor being coupled to the output terminal of the amplifier, a first terminal of the second transistor being coupled to the second input terminal of the amplifier and a second terminal of the second transistor being grounded through a third resistor.

2. The current sensing circuit of claim 1, wherein the first transistor and the second transistor are matched to each other.

3. The current sensing circuit of claim 1, wherein there is an input voltage difference between the two terminals of the sensing resistor and the second terminal of the first transistor has an output voltage, wherein a ratio of a first current flowing through the first transistor to a second current flowing through the second transistor is equal to a ratio of a resistance of the third resistor to a resistance of the second resistor.

4. The current sensing circuit of claim 3, wherein the filter circuit comprises:
    a first filter resistor, coupled between the first terminal of the sensing resistor and the first resistor;
    a second filter resistor, coupled between the second terminal of the sensing resistor and the second input terminal of the amplifier; and
    a filter capacitor, a first terminal of the filter capacitor being coupled between the first resistor and the first filter resistor and a second terminal of the filter capacitor being coupled between the second filter resistor and the second input terminal of the amplifier, a first current and a second current flow through the first filter resistor and the second filter resistor respectively.

5. The current sensing circuit of claim 3, wherein when the first current is equal to the second current and the resistance of the second resistor and the resistance of the third resistor are equal, a ratio of the output voltage to the input voltage difference is equal to a ratio of the resistance of the second resistor to a resistance of the first resistor.

6. The current sensing circuit of claim 3, wherein if a resistance of the first resistor is greater than ten times greater than a resistance of the first filter resistor and a resistance of the second filter resistor, a ratio of the output voltage to the input voltage difference is equal to a ratio of the resistance of the second resistor to a resistance of the first resistor.

* * * * *